(12) United States Patent
Shieh et al.

(10) Patent No.: US 9,397,282 B2
(45) Date of Patent: Jul. 19, 2016

(54) ACTIVE MATRIX LIGHT EMITTING DIODE ARRAY AND PROJECTOR DISPLAY COMPRISING IT

(71) Applicants: Chan-Long Shieh, Paradise Valley, AZ (US); Gang Yu, Santa Barbara, CA (US)

(72) Inventors: Chan-Long Shieh, Paradise Valley, AZ (US); Gang Yu, Santa Barbara, CA (US)

(73) Assignee: CBRITE INC., Goleta, CA (US)

( * ) Notice: Subject to any disclaimer, the term of this patent is extended or adjusted under 35 U.S.C. 154(b) by 0 days.

(21) Appl. No.: 14/620,910

(22) Filed: Feb. 12, 2015

(65) Prior Publication Data
US 2015/0249197 A1 Sep. 3, 2015

Related U.S. Application Data

(63) Continuation-in-part of application No. 13/713,744, filed on Dec. 13, 2012, now Pat. No. 8,962,377.

(51) Int. Cl.
| | |
|---|---|
| H01L 21/00 | (2006.01) |
| H01L 33/64 | (2010.01) |
| H01L 27/12 | (2006.01) |
| H01L 33/00 | (2010.01) |
| H01L 33/44 | (2010.01) |
| H01L 33/46 | (2010.01) |
| H01L 33/62 | (2010.01) |
| H01L 31/0368 | (2006.01) |
| H01L 27/146 | (2006.01) |
| H01L 31/0376 | (2006.01) |
| H01L 31/20 | (2006.01) |

(52) U.S. Cl.
CPC .......... *H01L 33/642* (2013.01); *H01L 27/1225* (2013.01); *H01L 27/1248* (2013.01); *H01L 27/1262* (2013.01); *H01L 27/1463* (2013.01); *H01L 27/14663* (2013.01); *H01L 27/14692* (2013.01); *H01L 31/0368* (2013.01); *H01L 31/0376* (2013.01); *H01L 31/20* (2013.01); *H01L 33/0075* (2013.01); *H01L 33/44* (2013.01); *H01L 33/46* (2013.01); *H01L 33/62* (2013.01); *H01L 2933/0025* (2013.01); *H01L 2933/0033* (2013.01); *H01L 2933/0066* (2013.01); *H01L 2933/0075* (2013.01)

(58) Field of Classification Search
None
See application file for complete search history.

(56) References Cited

U.S. PATENT DOCUMENTS

2012/0074441 A1* 3/2012 Seo .................. H01L 27/153
257/91

* cited by examiner

*Primary Examiner* — Evan Pert
*Assistant Examiner* — Shaka White
(74) *Attorney, Agent, or Firm* — Robert A. Parsons; Michael W. Goltry; Parsons & Goltry

(57) ABSTRACT

A method of fabricating a pixelated projector display includes providing a wafer with a supporting substrate, a first semiconductive layer, an emission layer, and a second semiconductive layer. The wafer is patterned into an array of LEDs/LDs and a planarization layer is deposited over the array. One via for each LED/LD element is formed through the planarization layer. A MOTFT backplane is positioned on the planarization layer, one driver circuit in controlling electrical communication with each via through the planarization layer. A passivation layer is deposited over the MOTFT backplane and heat plugs are extended through the passivation layer, the MOTFT backplane, the planarization layer, and the III-V LED/LD wafer partially through the first semiconductive layer to thermally couple heat from the array of LEDs/LDs to the surface of the passivation layer. An upper end of the heat plugs is accessible for thermal coupling to a heat spreader and/or a heatsink.

26 Claims, 12 Drawing Sheets

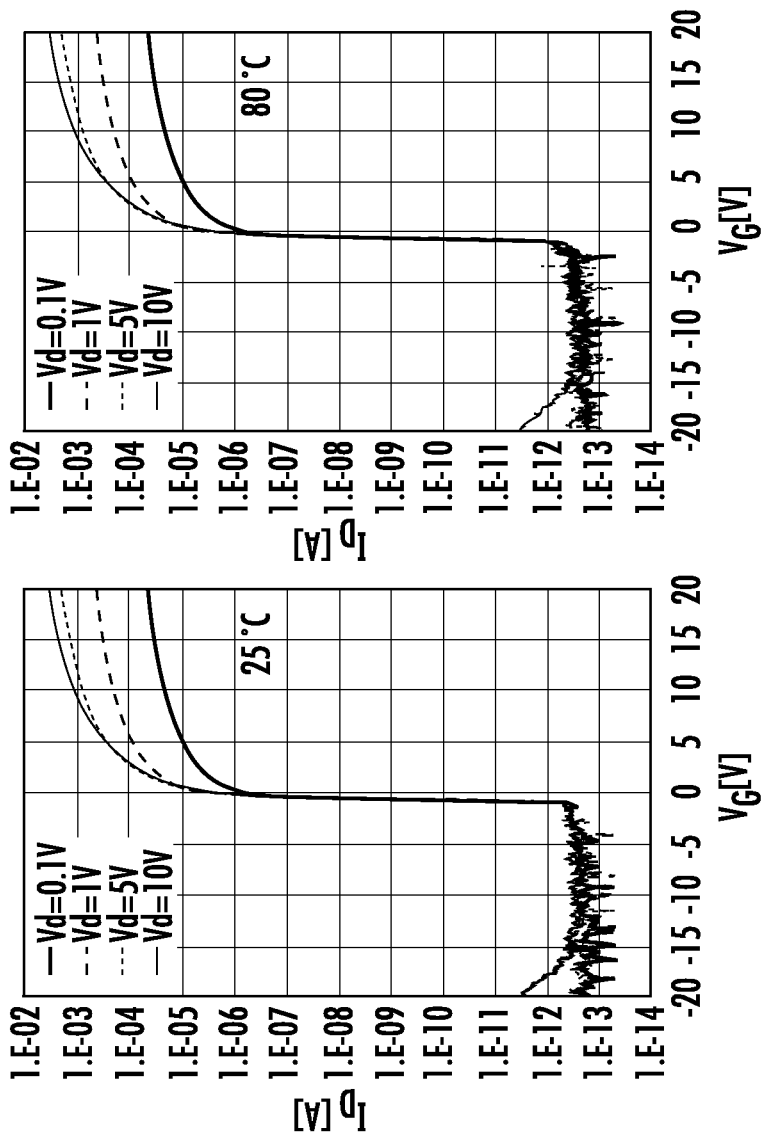

GaN pn LED

GaN pn LED AFTER PLANAIZATION

ACTIVE MATRIX LIGHT EMITTING DIODE ARRAY AND PROJECTOR DISPLAY COMPRISING IT

CROSS-REFERENCE TO RELATED APPLICATION

This application is a Continuation-in-Part of patent application Ser. No. 13/713,744, filed 13 Dec. 2012.

FIELD OF THE INVENTION

This invention generally relates to an active matrix light emitting diode array which converts input electric signals to output emitting light graphs and projectors comprising such display.

BACKGROUND OF THE INVENTION

In U.S. patent application Ser. No. 13/713,744, imaging array devices with metal-oxide thin-film-transistor (MOTFT) pixel readout circuit over PIN photodetector array were disclosed. Similar device architecture and process flow can also be used for making display devices in which each pixel comprises a MOTFT pixel driver circuit constructed with the MOTFT positioned over a light emitting display element made in PIN stack formation.

Recently, the emission efficiency of GaN LEDs has been improved rapidly to over 150 lm/W and it has become an ideal light source for projector displays due to its long operation lifetime compared with the gas discharge lamp. However, using an LED to replace the gas discharge lamp is limited by the size of the LED. It is hard to make a large uniform LED source that can work with a flat liquid crystal display (LCD) or digital micro-mirror display (DMD) engine. The major issues are current crowding and the loss of homogeneity as LEDs get larger. Here we propose to use an array of LEDs to overcome these issues. Because of the patterning into individual small LEDs (<100 microns), there are no issues of current crowding and inhomogeneity in driving the LEDs. The LED array consists of M×N LEDs where each LED can be driven independently to create the image. Each LED is very small and efficient without current crowding. To generate 5000 lm in a projector, assuming efficiency of 100 lm/W, one needs 50 W and 16 A of current (3V for GaN based PIN emission junction). Using current density of 10 A/cm$^2$, only an effective emission area of 1.6 cm$^2$ is needed. So the emitter array can be made in a very small area. Assuming a moderate fill factor (emitting area within each display pixel) of 30%, less than 5 cm$^2$ of GaN area is needed. The 10 A/cm$^2$ driving current is well below what the GaN LED is capable of (>100 A/cm$^2$). So one has the capability to increase the luminance by another factor of 10; i.e., 50000 lm. When such active matrix LED display (AMLED) is used in a projector for a commercial Movie Theater or for outdoor displays at brightness of 500 cd/m$^2$, over 100 square meter screen can be covered. Such AMLED is, thus, capable of making an extremely high power projector for indoor and outdoor display applications.

A key challenge for such high power density projector is to dissipate the heat. The heat removal through thermal conduction alone is difficult because of the other requirements, e.g., the heat spreading material in such a device has to be transparent. The best transparent heat spreader is the SiC or GaN substrate that is used to grow the GaN LED. Sapphire is also transparent, but its heat spreading capability (23 W/m-K) is much smaller than SiC (120 W/m-K) or GaN (130 W/m-K). GaN has the additional benefit of lattice matching and enables better quality crystal growth. GaN can also be grown on Si, but it is not transparent and the substrate has to be removed in order to optimize its optoelectronic performance.

Another challenge is to provide an active matrix to drive the large array of M×N individual LEDs. There are two solutions to this problem. One solution is to make m×n connections to Si driver chips by solder bumps. However, the solder bump yield is challenging to make the millions of connection and, in addition, there is another serious problem in using Si chip right on top of the GaN LED array. The high temperature of the GaN LED junction may cause the Si integration circuit (IC) to malfunction. The leakage current of Si field effect transistors (FET) increases rapidly with temperature because of its lower bandgap (1.1 eV). To make the active matrix work for such small pixel size, the FET leakage current has to be very small due to a limited size of storage capacitance. A FET based m×n array on silicon wafers is thus difficult for such high power density, high temperature applications.

The other solution is to make an active matrix driving circuit directly on GaN LED wafers using TFT technology with a higher bandgap semiconductor channel, as disclosed in detail in this invention. The current-voltage dependence and the "off" current of a high bandgap MOTET is not strongly dependent on temperature and can be kept very small at temperatures even above 100° C. (Gang Yu et. Al., Symposium Digest of Society of Information displays, Vol. 43, p.1123 (2012); Gang Yu, et al., The 14$^{th}$ International Meeting of Information Displays, Daegu, Korea, Aug. 25-29, 2014). Also it can be made directly on top of a GaN LED and there is no need to use the low yield solder bump to make the millions of connection.

It would be highly advantageous, therefore, to remedy the foregoing and other deficiencies inherent in the prior art.

Accordingly, it is an object of the present invention to provide a high pixel density, active matrix LED array for high power projector display.

It is another object of the present invention to provide an AMLED display with MOTFT pixel driver circuits on top of a PIN LED array without a solder bonding layer.

It is another object of the present invention to provide an AMLED display with MOTFT pixel driver circuits with low leakage current, low storage capacitor and a large operation temperature range.

It is another object of the present invention to provide an AMLED display with improved thermal conduction, improved current density and improved output optical power.

It is another object of the present invention to provide a new and improved process for fabricating an active matrix light emitting array with a metal-oxide thin film transistor (MOTET) array.

It is another object of the present invention to provide a new and improved process for fabricating AMLED arrays using a fewer number of process steps.

It is another object of the present invention to provide a new and improved process for fabricating AMLED arrays with high pixel counts and high pixel density for large screen projectors for indoor and outdoor applications.

It is another object of the present invention to provide a new and improved process for fabricating an AMLED array without a solder bond layer and with improved operational stability.

It is another object of the present invention to provide a new and improved process for fabricating AMLED displays with more pixels and with smaller pixel pitch.

SUMMARY OF THE INVENTION

The desired objects of the instant invention are achieved in accordance with an embodiment of a method of fabricating a pixelated projector display including the step of providing a III-V LED/LD wafer {LD is a laser diode) including a supporting substrate, a first type semiconductive layer on the substrate and a second or opposite type semiconductive layer overlying the first type semiconductive layer. The III-V LED wafer is patterned into an array of LEDs. In a preferred embodiment, an emission layer is sandwiched between the first type semiconductive layer and the second type semiconductive layer to form an array of pin diodes, instead of pn diodes (LED is used throughout as an example only). The light-emitting I layer can have either uniform composition or a stack of bi-layers with two different compositions (often called multiple quantum wells, MQW). A planarization layer is deposited over the array of LEDs and vias are formed through the planarization layer, one via for each LED in the LED array. A MOTFT backplane including an array of MOTFT pixel driver circuits is positioned on the planarization layer, one driver circuit in controlling electrical communication with each via through the planarization layer, whereby an AMLED display is formed. A passivation layer is positioned over the array of MOTFT driver circuits and heat plugs are extended between adjacent LEDs through the passivation layer, the MOTFT backplane, the planarization layer, and the III-V LED wafer partially through the first type semiconductive layer to thermally couple heat from the array of LEDs to the surface of the passivation layer. An upper end of the heat plugs is accessible for thermally coupling to a heat spreader and/or a heatsink.

The desired objects of the instant invention are also achieved in accordance with a specific embodiment thereof wherein a structure including a pixelated projector display is provided. The pixelated projector display includes a III-V LED/LD wafer including a supporting substrate, a first type semiconductive layer on the substrate, an emission layer on the first type layer, and a second or opposite type semiconductive layer on the emission layer. The III-V LED wafer defines an array of LEDs/LDs. A planarization layer positioned over the array of LEDs and vias extend through the planarization layer, one via for each LED in the LED array. A MOTFT backplane includes an array of MOTFT pixel driver circuits positioned on the planarization layer, one driver circuit in controlling electrical communication with each via through the planarization layer, whereby an AMLED display is formed. A passivation layer is positioned over the array of MOTFT driver circuits and heat plugs extend between adjacent LEDs through the passivation layer, the MOTFT backplane, the planarization layer, and the III-V LED wafer partially through the first type semiconductive layer to thermally couple heat from the array of LEDs to the surface of the passivation layer. An upper end of the heat plugs is accessible for thermally coupling to a heat spreader and/or a heatsink.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which:

FIG. 9, *a* and *b*, illustrate graphs of Id-Vgs of a TFT with w/l=6.6 for Vds=0.1 v, 1.0 v, 5.0 v, and 10 v at 25° C. and 80° C., respectively;

DETAILED DESCRIPTION OF THE DRAWINGS

In U.S. patent application Ser. No. 13/713,744 (4674-A27, allowed in October 2014), imaging array devices with metal-oxide thin-film-transistor (MOTFT) pixel readout circuit over PIN photodetector array were disclosed. In such devices, the pixel readout circuit layer is fabricated directly on the PIN photodiode array. Basically, the light illumination can be from the top or the bottom. For example, if the substrate of the PIN diodes is not transparent, e.g. germanium or silicon photodiodes, the illumination can only come from the top. In the present description, top illumination is described for convenience. In a typical example for X-ray imager, the X-ray scintillator film which converts x-rays to visible rays is laminated to the top surface instead of to the bottom surface. This arrangement is due to the fact that the substrate separates the scintillator film from the detector and the thickness of the substrate can reduce the resolution.

Also, with top illumination, a transparent top electrode is required for the PIN photodiode array. In a typical a-Si or poly-Si TFT, the transparent electrode requires one or more extra steps to deposit a transparent conductor, such as indium-tin-oxide (ITO). Another, issue with the bottom photodiode approach is the coupling capacitance of the data and gate lines to the photodiode common electrode. To reduce or substantially eliminate this capacitance a thick low k dielectric must be positioned between the data and gate lines and the photodiode common electrode. In the prior art including the thick dielectric required additional process steps.

Figure 1:
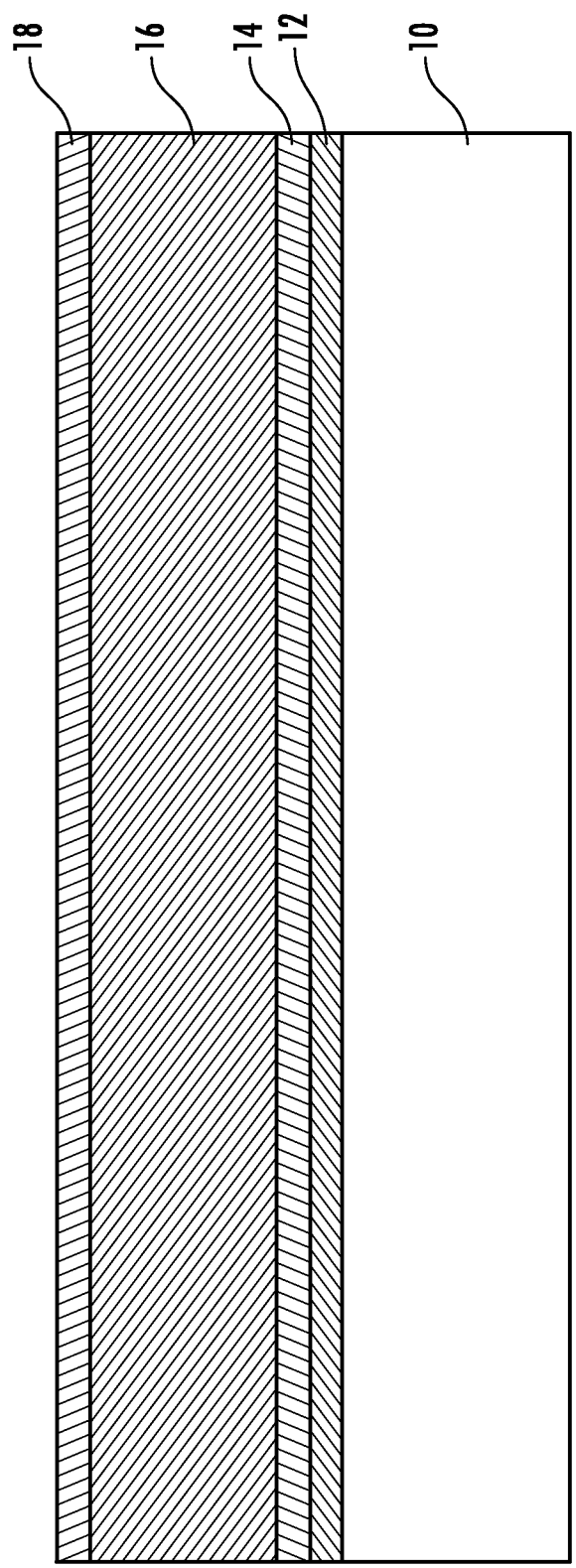
FIGS. 1 through 7 show simplified layer diagrams illustrating intermediate structures in a simplified process for fabricating imaging arrays in accordance with the present invention.

Referring specifically to FIG. 1, a substrate 10 is illustrated with a bottom metal electrode 12 formed thereon. As will be understood from the following description, bottom metal electrode 12 is a common electrode for a photodiode array fabricated thereon. In many cases, a non-patterned metal or doped semiconductor electrode can be used. In some special cases for high pixel counts, or for further reducing the capacitive coupling between the bottom common electrode and the top column/row electrode lines. The bottom common electrode can be patterned in two-dimensional grid form so as to leave most of the area underneath the top column/row grid electrode lines open. For simplicity and explicitly, bottom electrode 12 in FIG. 1 is drawn in continuous form reflecting either un-patterned form, or in the continuous area in patterned form. The corresponding mask step is not counted in the following process flow.

A first semiconductor layer 14 is deposited on electrode 12 and may be either n or p type conductivity. A layer 16 of intrinsic semiconductor material is deposited on layer 14 and a layer 18 of opposite conductivity material (i.e. p or n) is deposited on layer 16. It will be understood that the three layers form a sensing element or in this case a PIN diode detector (photodiode), which is a preferred embodiment for its efficiency. However, if simple p/n diodes are sufficient, intrinsic layer 16 can simply be omitted. In either process, layers 12, 14, 16, and 18 are contact and p-i-n photodiode blanket layers, or sensing element blanket layers, deposited over substrate 10 and no masks are required.

The sensing element blanket layers can be in either crystalline or amorphous form. Examples of materials that can be included in the sensing element blanket layers in the p-i-n stacks include silicon, germanium, selenium, SiGe, GaAs, InGaAs, SiC, GaN, CuO, CuSe, CuTe, CdS, CdSe, CdTe, InSb, CuInGaS, CuInGaSe, CuInGaTe, TeGeHg, CuInSe, CuInS, CuInTe, HgCdTe, or their combinations in either amorphous or crystalline form. Take crystalline germanium, or Ge—Si alloy as an example, doped crystal can be used as the substrate directly, the intrinsic i layer can be formed by de-doping or by reverse-doping with opposite valance elements. For the visible image array, amorphous silicon (a-Si) p-i-n stack can be formed directly by PECVD process.

In addition to (or instead of) the p-i-n photodiode array, other sensing elements can be formed with a sensing function layer sandwiched between the top and bottom electrodes. For example, a thermal image array can be formed with a thermoelectric layer in the sensing area. In another example, a large size, ultrasonic sound wave detector array can be formed when a piezoelectric layer is used between the top and bottom electrodes. Also, as mentioned above, a scintillator film for an x-ray imager can be formed in the sensing area.

Figure 2:
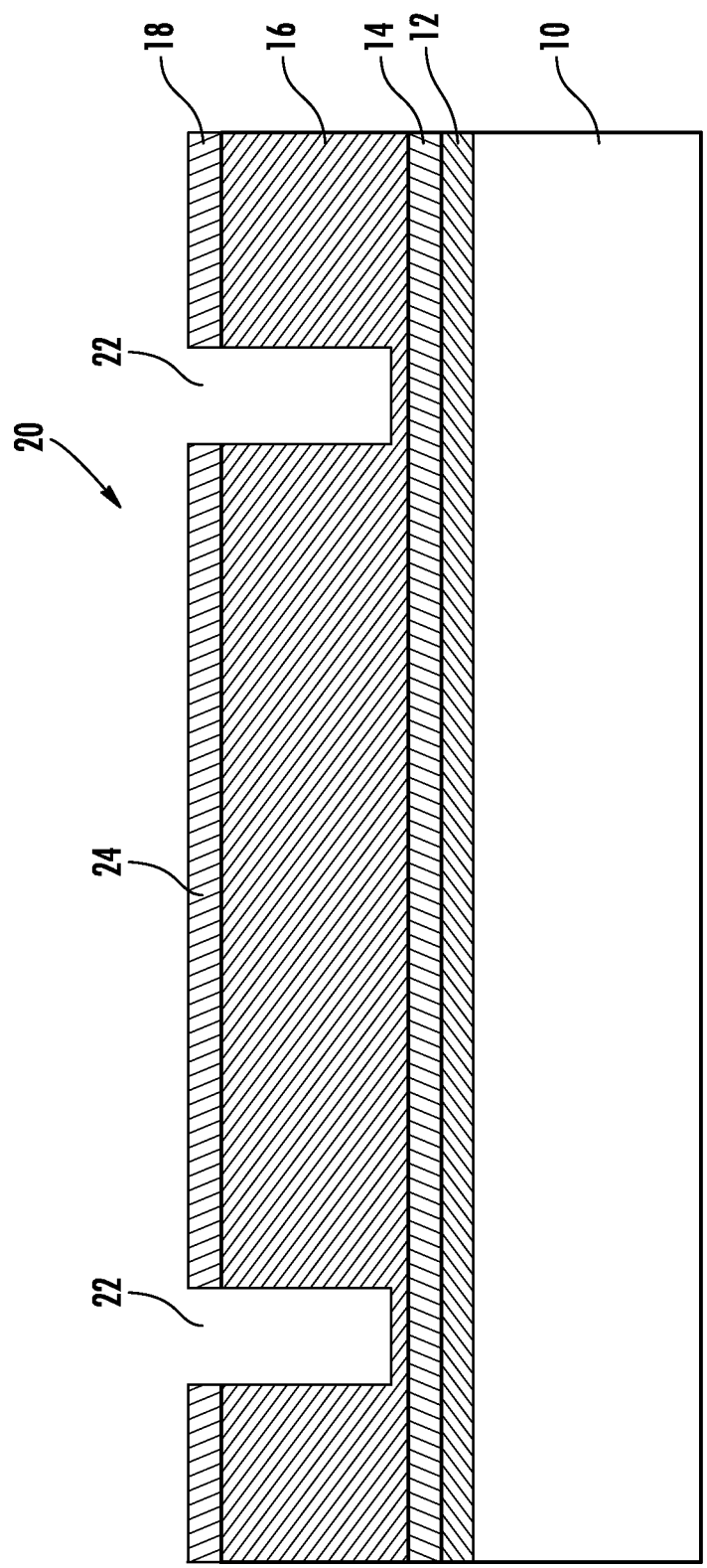
Figure 3:
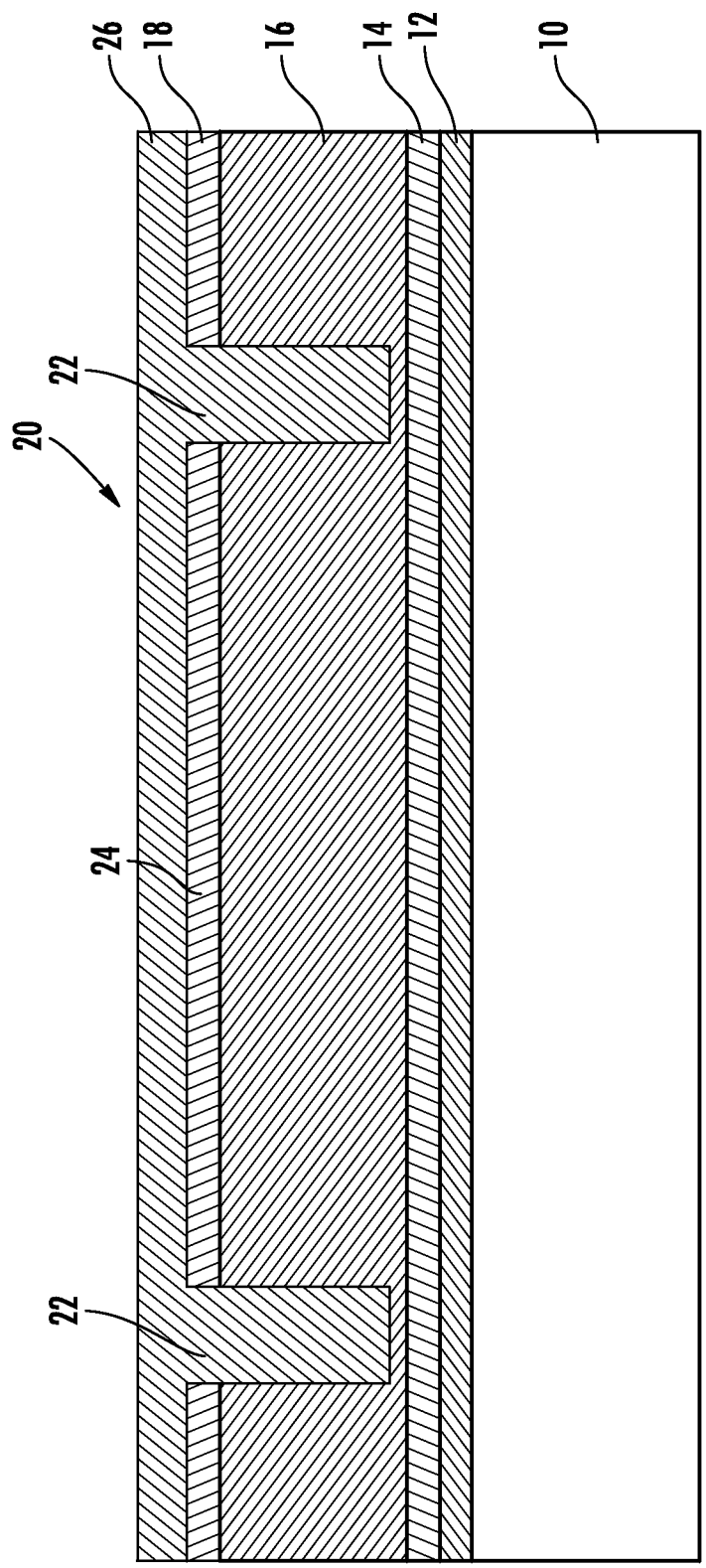

Turning to FIG. 2, the structure illustrated and described in conjunction with FIG. 1 is patterned (first mask step) into an array of individual PIN diodes with separate top contacts. In this process deep trenches 22 are etched through layer 18 and layer 16 for isolation but the etching stops short of layer 14 in this embodiment. In the present illustration only one photodiode 20 (sensor element) of the array will be shown in its entirety for simplification of the drawings and disclosure. Photodiode 20 has a top contact 24. As illustrated in FIG. 3, the structure is planarized with a coating 26 of low k dielectric material (with a dielectric constant below approximately 6 and preferably below approximately 4). Examples of low k dielectric material that can be processed by a coating process (such as spin coating, slot coating, spray coating, etc.) include polymer PMGI, polystyrene, PMMA, or other type acrylic polymer, Polyethylene, polyimide, polyvinyl phenol (PVP), zeon, PET, PEN, PES, PAN, BCB, SU8, silane- or siloxy-lane based, metallo-organic based (such as magnesium-based, or copper-based) compounds, spin on glasses, graphene oxides and other combinations in blend or multi-layer form. It will be noted that trenches 22 are formed as deep as practical in this preferred embodiment (only upper layer 18 could be etched to separate the photodiodes) so that the low k dielectric material is very thick in the trench area. The method of patterning such low k material is well known to experts in the field, either wet-etching or dry-etching can be used.

Figure 4:
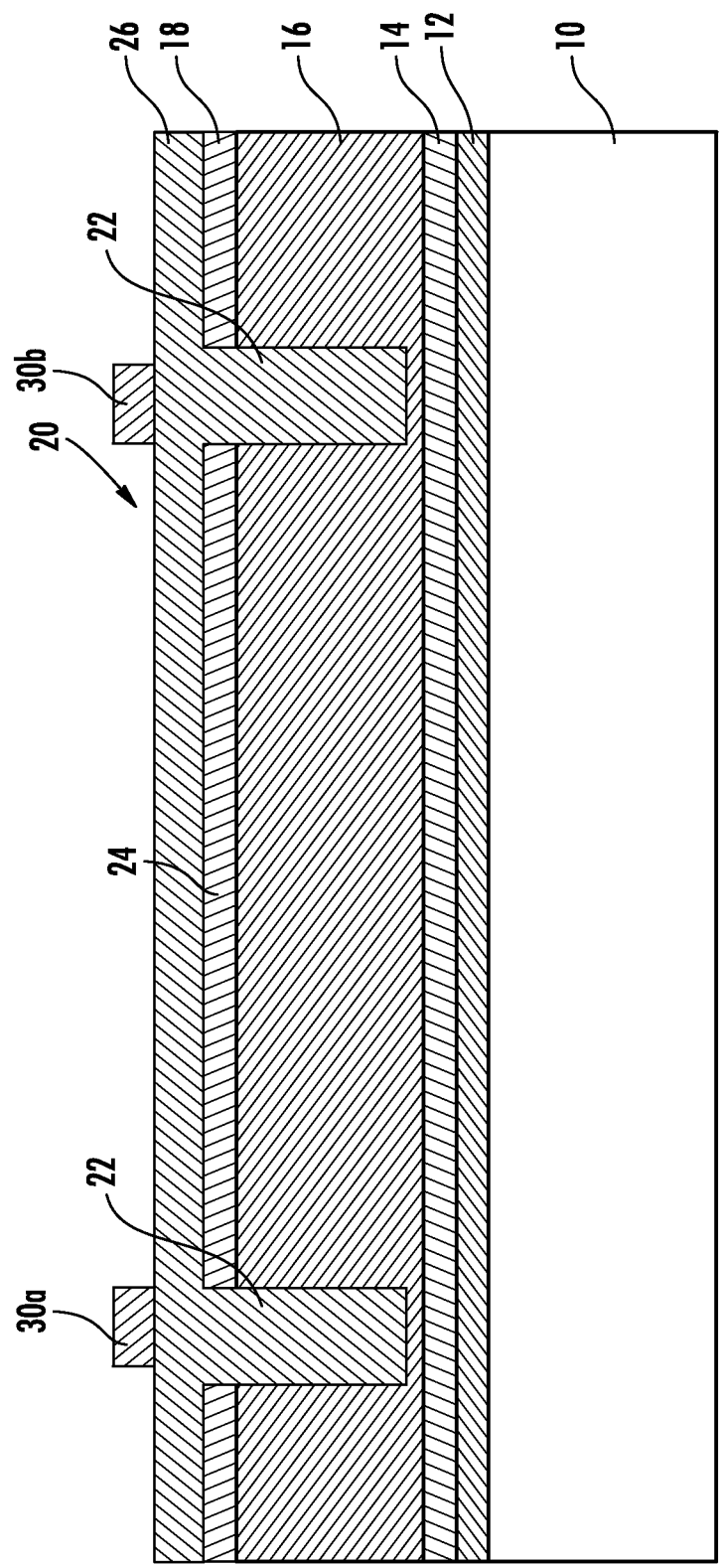

Referring additionally to FIG. 4, gate metal 30 is deposited and patterned ($2^{nd}$ mask step) onto planarizing coating 26. Here it is to be understood that gate electrodes, designated 30a in FIG. 4, are deposited on the array with one each defining a TFT in conjunction with each photodiode in the array. Also, gate lines and data lines, represented by 30b in FIG. 4, are deposited in overlying relationship to trenches 22. The gate lines and the data lines are positioned over trenches 22 so that the thick low k dielectric material 26 substantially reduces coupling capacitance between gate metal 30 and bottom or common contact 12.

Figure 5:
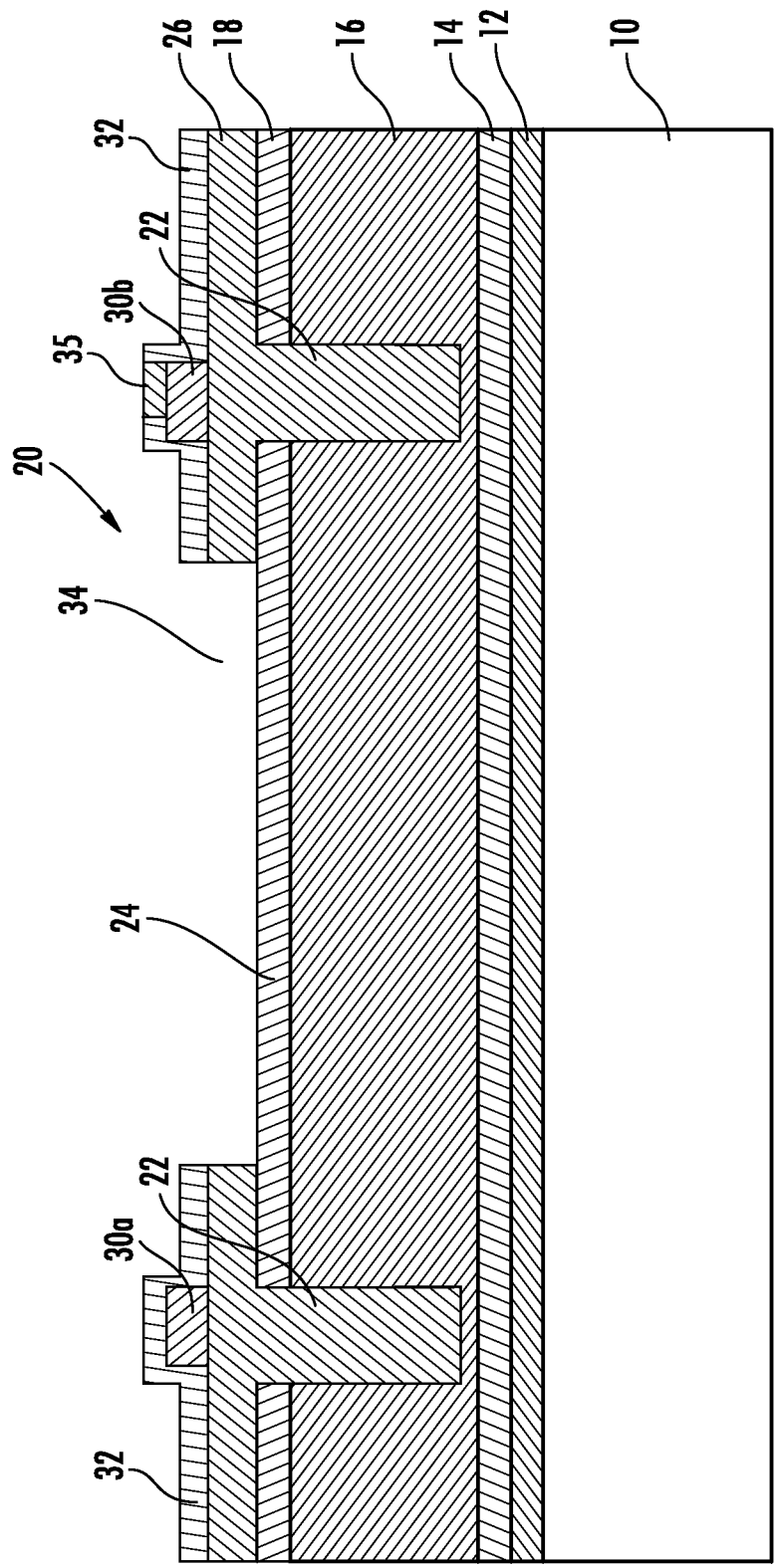

Referring now to FIG. 5, a blanket gate dielectric layer 32 is deposited over the structure. Vias 34 are opened through gate dielectric layer 32 and through planarizing coating 26 to expose an upper surface of top contact 24 of photodiode 20 and each of the other photodiodes in the array. This is the third masking step in the process. It should be noted that an opening or via, designated 35, can also be provided in this third masking step to the adjacent line 30 to provide for external connections that will be shown later and understood from the description.

Figure 6:
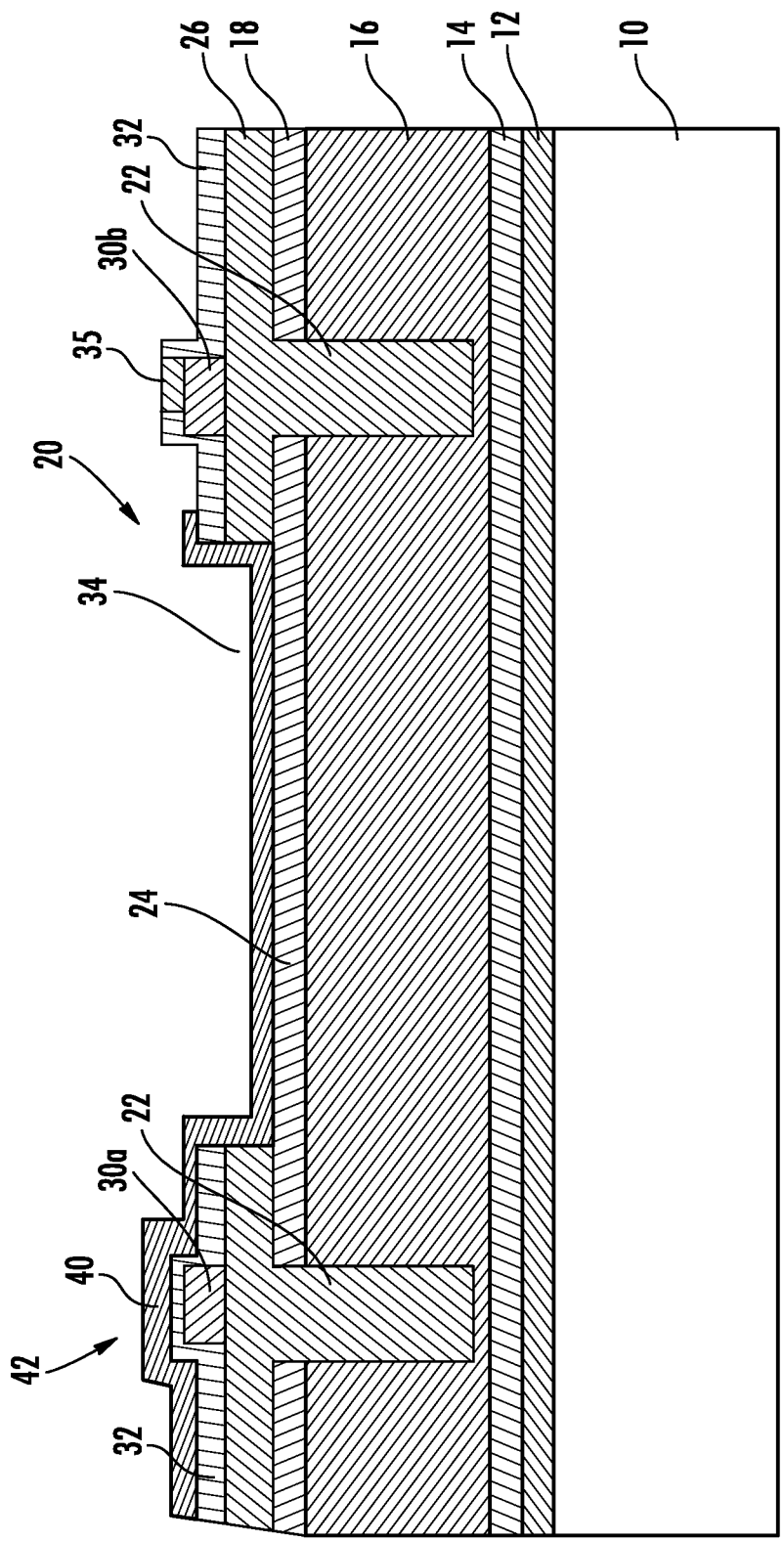

Referring to FIG. 6 a metal oxide semiconductor layer 40 is deposited as a blanket layer and patterned ($4^{th}$ mask step) to form the channel for a TFT 42 and to overlie and contact the top contact 24 of photodiode 20. Metal oxide layer 40 is transparent to the radiation wavelengths sensed by the photodiodes. Some typical examples of transparent metal oxides include ZnO, InO, GaO, AlZnO, ZnInO, InAlZnO, InGaZnO, InSnZnO, ZnSnO, GaSnO, GaInO, InGaSnO, InGaCuO, InCuO, CuZnO, GaCuO, GaZnO, AlCuO, etc. and their combinations. The, metal oxide semiconductor layer 40 may be in either amorphous or polycrystalline form. However, amorphous or nanocrystalline (grain size substantially smaller than TFT dimensions is preferred for uniformity of the image array).

Figure 7:
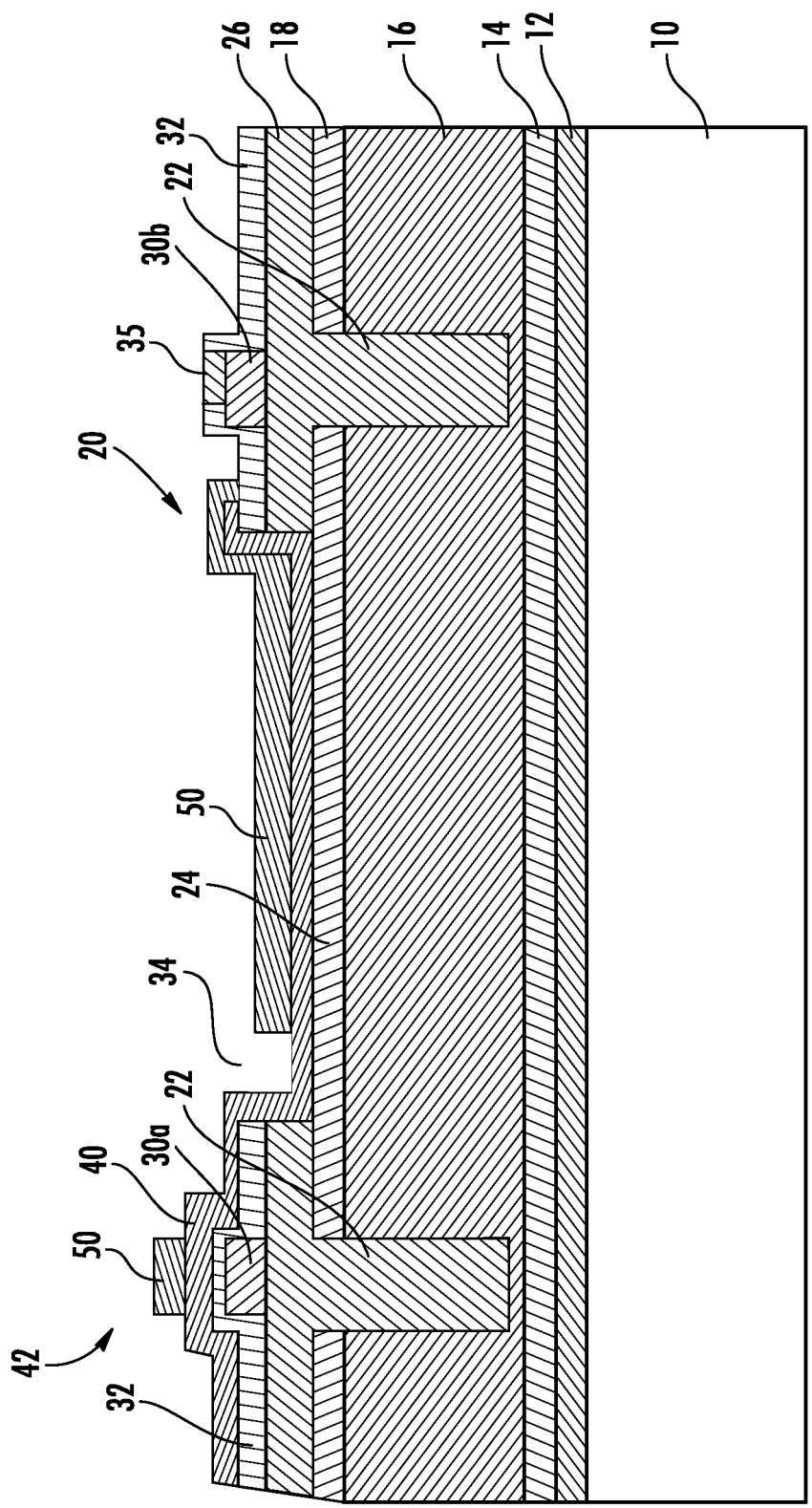
Figure 8:
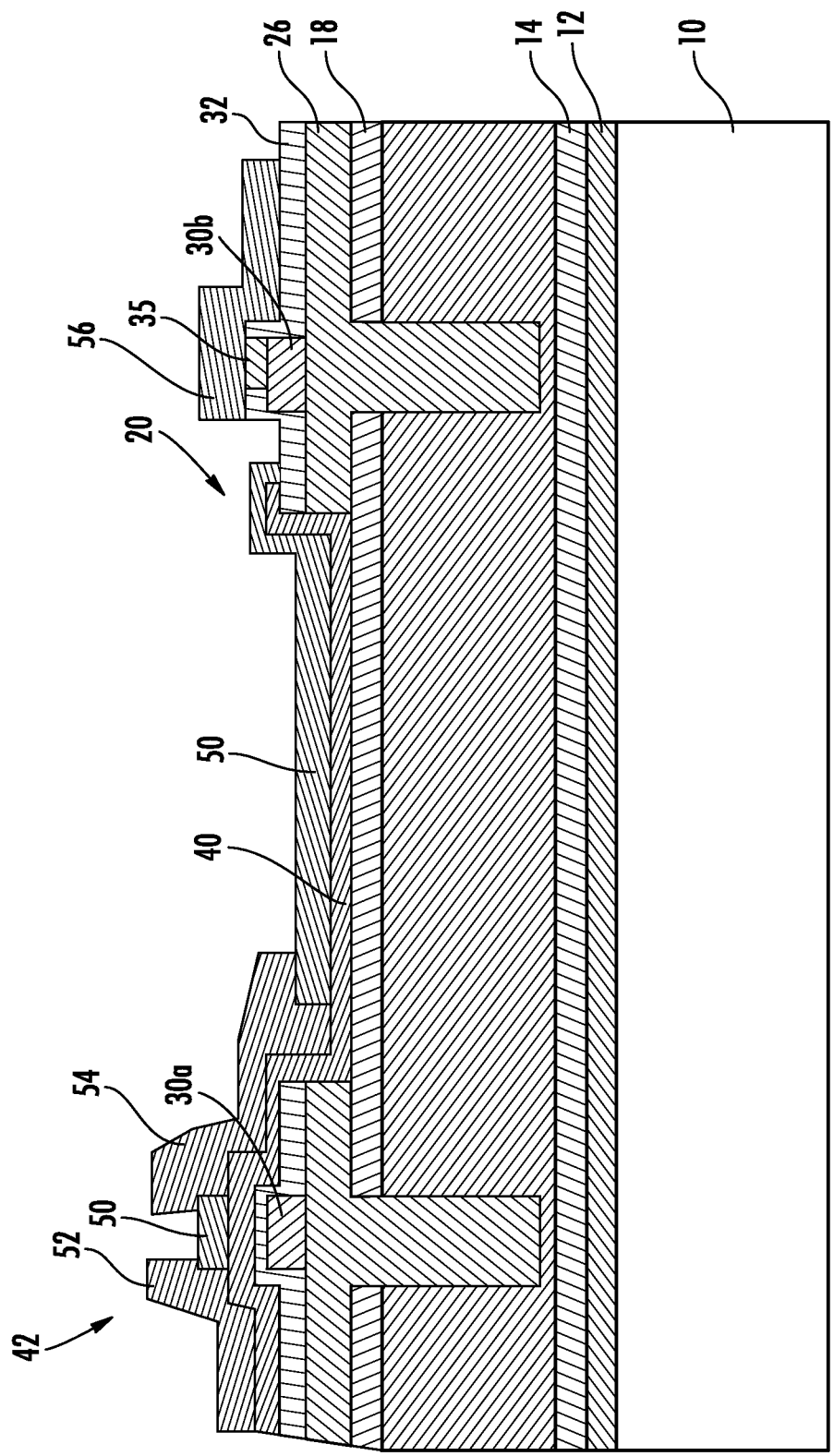
FIG. 8 is a simplified layer diagram illustrating the final imager in accordance with the present invention.

Turning to FIG. 7, an etch stop layer 50 is blanket deposited and patterned ($5^{th}$ mask step) to overlie gate 30 of TFT 42 and to overlie a major portion of top contact 24 of photodiode 20. Etch stop layer 50 is formed to define an active area in the metal oxide semiconductor material overlying gate electrode 30a. A blanket source/drain metallization layer is then deposited on the structure and patterned ($6^{th}$ mask step) to separate the metal layer into source/drain contacts 52/54 on opposite sides of the active area and to form a contact 56 with the adjacent gate line 30 through via 35. Etch stop layer 50 allows etching of the metallization layer without damaging metal oxide layer 40. In an alternative process to the TFT with an etch stop layer on top of the channel, the TFT can be made with a so-called back channel etching (BCE) method (sometimes referred to as "selective etching") by the proper selection of the channel material and the S/D etching process. That is by selecting the various materials the metallization layer can be etched without damaging metal oxide layer 40 and the extra step of patterning an etch stop layer can be eliminated.

Here it should be noted that metal oxide layer 40 serves as a transparent contact layer between TFT 42 and PIN diode 20. The transparent contact (metal oxide layer 400 between TFT 42 and photodiode 20) is defined by the metal oxide etch mask ($4^{th}$ mask step), the etch stop mask ($5^{th}$ mask step), and the S/D metallization etch mask ($6^{th}$ mask step). Thus, no additional deposition or masking steps are required to define the transparent top electrode of photodiode 20. It should also be noted that the portion of transparent contact layer (metal oxide layer 40) between TFT 42 and PIN diode 20 mostly overlies layer 18. Layer 18 has a tendency to absorb oxygen from metal oxide layer 40, thereby increasing the conductivity (carrier density) to render that portion of metal oxide layer 40 an electrical conductor (rather than a semiconductor). The portion of metal oxide layer 40 overlying the gate contact is adjacent gate dielectric layer 32, which does not effect the conductivity (i.e. absorb oxygen) so that the portion of metal oxide layer 40 defining the channel of TFT 42 remains a semiconductor.

Optional filters, micro-lens, or passivation layers can be deposited or laminated on top of the sensor element array. Some examples of a thin film passivation layer include Al2O3, MgO, SiO2, SiN, or PbO, which can be formed by either sputter, or chemical vapor deposition (CVD). In the case of a high energy radiation detector array, a passivation layer with heavy elements in the periodic table (such as PbO) could be used as thin passivation as well as a radiation blocker. Transmission enhancement can also be achieved with a MgO, MgF2 or a SiO2 layer, or a layer of other type of low k dielectric material. An optical micro-lens array on top of each sensing element can be formed with a transparent material using a proper patterning and etching process.

Although a single TFT is used in describing the process disclosed, sensor pixel circuits with multiple TFTs and more buslines can be designed with the same principle. Only 1-2 more masks are needed for vias and wire connections. In addition to TFTs, capacitors can be made with the gate insulator and the electrode layers under and above. Resistors can be made with the semiconductor metal oxide. The pixilated imager disclosed in this invention can thus be generalized as comprising image pixels comprising a radiation element plus an image readout circuit incorporated in or with the metal oxide TFT.

It will be understood that the TFT pixel electronics can be made transparent with transparent data lines and gate scan lines (lines to gates 30, not visible). Transparent data lines and gate scan lines are especially important for high density imagers where the pixels are very small and the fill factor can become very small if opaque data lines and gate scan lines are used. It should also be noted that arrays incorporating active pixels or passive pixels are both possible when using the present invention.

Although a top-sensing configuration is used in describing the method of fabrication and the structure of the pixilated image array, the same structure and configuration can be used for bottom-sensing imagers as well. For the same device to be used for bottom-sensing or even bi-directional sensing, the bottom electrode and the substrate are formed of material transparent to the wavelength range it is desired to sense. When needed, the substrate can also be thinned to a desired thickness substantially smaller than the dimensions of the image pixels. By combining the functions of top-sensing and bottom-sensing, an image array with radiation sensitivity from both sides can be achieved.

With the device structure and process flow, a sensor array with multiple detection bands (such as visible and infrared) can also be achieved. For example, a dual-band sensor array with image element in p-i1-n-i2-p or n-i1-p-i2-n form can be fabricated. This image element essentially forms two p-i-n diodes coupled in series. In this structure the detection band can be selected by flipping the biasing polarity between the bottom electrode and the top electrode. In this biasing scheme, one p-i-n diode is selected or connected in reverse biasing and sensing mode while the other one is connected in a forward biasing mode, thereby providing a conductive path. In addition to the vertical arrangement described, the multiple band sensing elements can alternatively or additionally be arranged in the same latitude. The band selection can be accomplished by means of a selection switch that flips the bias on all of the dual band sensor elements in the dual-band sensor array.

Other than large size, high pixel density image arrays, the device architecture and process flow disclosed above can alternatively be used for making projector display devices in which each pixel comprises a MOTFT pixel driver circuit constructed with MOTFT over a light emitting display element made in PIN stack.

We note that the high mobility and stability metal-oxide TFT developed at CBRITE Inc. recently (U.S. Pat. No. 7,812,346, U.S. Pat. No. 8,907,336, U.S. Pat. No. 8,679,905, U.S. patent application Ser. No. 13/536,641, U.S. patent application Ser. No. 13/902,514, U.S. patent application Ser. No. 14/081,130, U.S. patent application Ser. No. 14/216,920) are especially promising for such project displays: (1) due to its high carrier mobility, the MOTFT provides sufficient pixel current for driving the light emitting element within each small pixel dimensions, (2) high operation stability of such MOTFT: I-V performance did not change after passing over 100 Coulomb charges through the TFT at accelerated testing conditions, and (3) the high energy gap, high quality metal-oxide semiconductor film used as the channel layer allows the MOTFT to be driven in a broad temperature range without performance change (Gang Yu et. Al., Symposium Digest of Society of Information displays, Vol. 43, p.1123 (2012)). FIG. 9 shows a set of Id-Vgs from such MOTFT at 25° C. and 80° C. The data were taken from a TFT with W/L=6.7. The current switch ratio is beyond $10^{10}$ at Vgs=+/−10V, and the off current of such TFT shows no change when the substrate temperature is raised from room temperature (25° C.) to 80° C., independent of Vds bias. In fact, the off current collected in this data set was limited by the data collection setting. When a slower I-V swapping speed is taken, and a more sensitive data collecting range was used, OFF current at $10^{-15}$ A, independence to Vds in 0.1 to 10V range were revealed. In another test, the Id-Vg data were collected from −10° C. to 120° C. The Off current and the current switch ratio were confirmed to show no change in such a broad range.

This high stability, temperature insensitive current-voltage characteristic is in sharp contrast to that in a FET made with crystalline silicon wafers, and is perfect candidate for driving LED emitter array with high current (and other high power) density and for outdoor applications under harsh environmental conditions. At the operating current, the junction temperature of a PIN LED increases from its resting level (non-operation). The best TFT for constructing the pixel driver for an LED display should have a feature of driving current insensitive to substrate temperature at the pixel location. The low off current at broad temperature range enables a small storage capacitor (and thus small geometric size fitting within the pixel pitch size) in the pixel driver. Both LED array and MOTFT pixel driver array are made of semiconductors with high energy gaps which optimizes the temperature stability for the entire AMLED display system.

The LED array used in this projector display consists of M×N LEDs where each LED can be driven independently to create the display image. In contrast to a passive matrix driving method used in LED tiles (typically in 16×16 to 64×64 formats for each tile) which has been used for outdoor commercial display screens in public arena, an active matrix driving scheme with MOTFT pixel driver is proposed here for driving a high pixel density LED array in M rows and N columns with M and N substantially beyond 100.

There have been reports of a micro-LED display made with welding a patterned LED array with a Si wafer based pixel driving circuit (J. Day, J. Li, D. Y. C. Lie, C. Bradford, J. Y. Lin, and H. X. Jiang, III-Nitride full-scale high-resolution micro-displays, Appl. Phys. Lett. 99, p. 031116, 2011). However, to the experts in the field, it is challenging to make the millions of required connections with a flip-chip process. Yield and reliability are the top two issues to be dealt with. There is another serious problem in using a Si chip directly on top of the GaN LED array. The high temperature of the GaN LED junction may cause the Si IC to malfunction. Also, the leakage current of Si increases rapidly with temperature because of its lower bandgap (1.1 eV). To make the active matrix work, for such small pixels, the leakage current of the pixel switch has to be very small because the storage capacitance is very small (limited by space availability of the pixel size). Because of this, the test pixel current used in the paper referred above was only 1 μA. The display in this paper was only intended to be used for micro-displays for near eye applications rather than for a projector operating at high current density.

The device structure and the process disclosed in this application provide an unique approach for a high power density projector display operate-able in a broad temperature range.

To make a small GaN LED efficient, the LED is preferably surrounded by reflecting surfaces on all sidewalls other than the emitting surface. A simple process to create an array of efficient LEDs with such structure is provided by the following description.

Figure 10A:
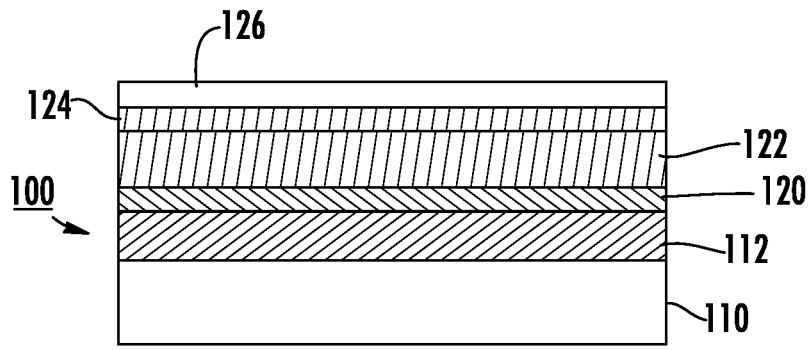
FIG. 10 (*a*)-(*d*) illustrate several steps in the process of fabricating an array of III-V p-i-n LEDs.

Referring to FIG. 10(a), the process starts with a GaN LED wafer 100 (while GaN is the preferred LED emission material and is used throughout this description, it will be understood that other III-V emission materials (in which III and V represent elements in $3^{rd}$ and $5^{th}$ columns of periodic table, e.g. GaN, InGaN, or AlInGaP} and combinations thereof may be used with proper structure for light emitting and includes an n-layer 112 deposited/grown on a transparent substrate 110, an emission layer 120 of GaN deposited/grown on n-layer 112, and a p-layer 122 deposited/grown on emission layer 120. It will be understood that while wafer 100 is illustrated and described as preferably including p-i-n semiconductor layers to form pin diodes, in some applications p-n semiconductor layers could be included to form simpler pn diodes. It should also be understood that while the term "wafer" is used to depict the overall structure, any wafer, portion of a wafer, chip, etc. may be used. A dry-etchable metal layer 124 (such as TiW) is then deposited on p-layer 122 as a first layer ohmic p-contact and a layer 126 of PECVD SiN is deposited on layer 124 as materials for an etch mask 128 shown in FIG. 10(b).

Figure 10B:
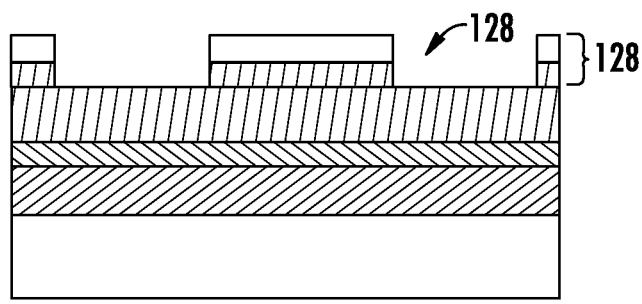
Figure 10C:
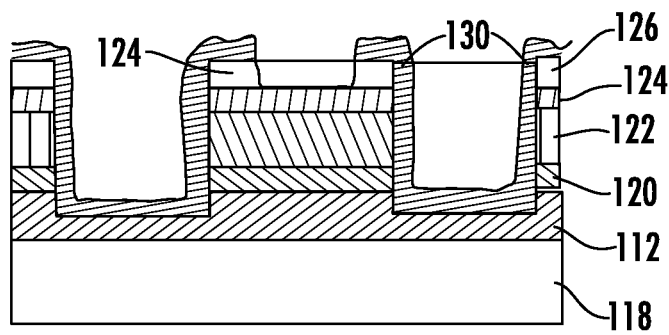

Referring to FIG. 10(b), SiN and TiW layers 126 and 124 are patterned into an array of isolated islands, corresponding to an emission area of each display pixel and completing etch mask 128. This pattern is then transferred into GaN pn (or P-I-N in which the I refers to the emission layer with low carrier density which could be in a single composition layer or a stack of bi-layer with two different compositions, often called multiple quantum wells, MQW) LED structures as illustrated in FIG. 10(c). In this process, etch mask 128 is used to etch LED wafer 100 partially into n-layer 112 by dry etch in chlorine containing gas in a dry etch (RIE or ICP) process.

Figure 10D:
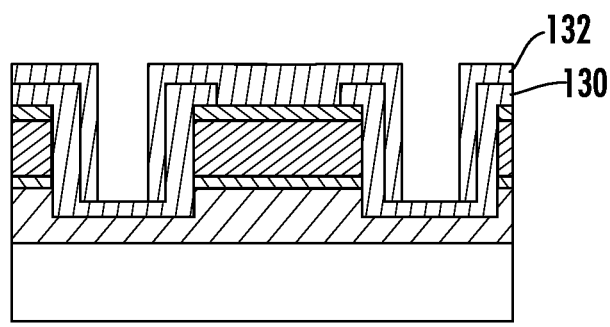

Referring to FIG. 10(c), another layer 130 of PECVD SiN is then deposited on the surface of the structure and the SiN layer 130 and 126 on top of the dry-etchable metal layer 124 is patterned by photolithography and etched away. As illustrated in FIG. 10(d), another layer 132 of metal reflecting material (e.g. Al, Au, Ag) is then sputtered onto the structure. Reflector layer 132 is then patterned into islands again by etching off a portion of the area overlaying the n-layer of the wafer (as shown in FIG. 10d). Patterned reflective metal layer 132 along with the dry-etch metal layer 124 (see FIG. 10(c)) forms optical mirrors on sides and top of the islands, reflecting emitted light from the PIN junction and emitting the light out from the bottom side through the n-layer and the substrate.

The side wall of each patterned LED element does not need to be perpendicular to the PIN layers. It is known to experts in the field that one can form the side wall in a tilted angle with the PIN stack by etching control or by properly selecting the wafer crystalline surface. For example, one could achieve the top surface of the islands smaller (or larger) than the area near the foot (forming vertical keystone in cross section). Such non-vertical side wall can be used to optimize emission output from the LED array.

When pixel size is reduced, the emission efficiency at low current levels may be reduced due to competition of non-radiative recombination at the sidewall interface. To minimize such effect and optimize emission efficiency at a broad operation brightness range of interest, the thickness of the I layer used in the LED array is typically thinner than those used for high power LED lamps with large emitter size.

Proper surface treatment with plasma and annealing at elevated temperature on the pixel side wall before depositing SiN layer 130 in FIG. 10(c) can also be used for improved emission efficiency at low operation current.

Figure 11:
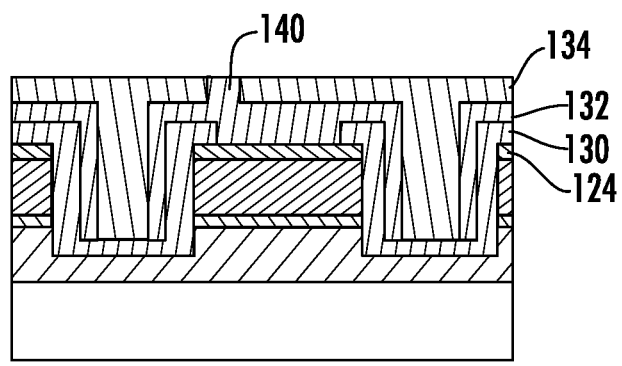
FIG. 11 illustrates the steps in the process of forming a planarization layer and vias connecting the top electrode of each LED emitting element to pixel driver circuits above the planarization layer.

Referring to FIG. 11, the wafer is then planarized with a layer 134 of a proper dielectric (either organic or inorganic or both) and a via 140 is formed through planarization layer 134 for each pixel in the array, which provides a contact to each PIN diode in the array.

Figure 12:
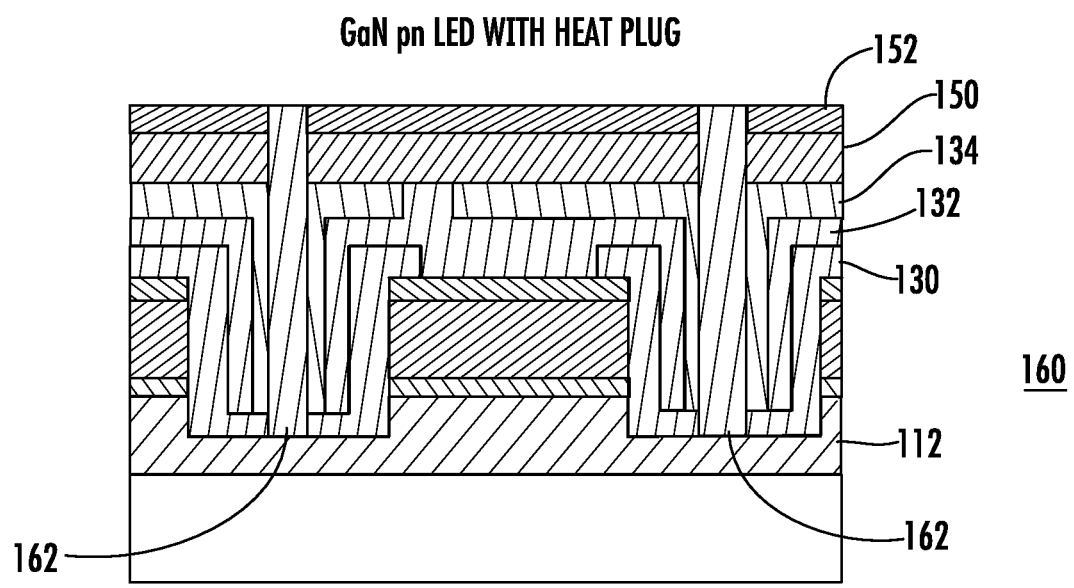
FIG. 12 illustrates the fabrication of a heat distribution system after the fabrication of a TFT array on the LED array of FIG. 10.

Referring to FIG. 12, a MOTFT backplane (designated 150) can be fabricated directly on planarization layer 134 using the process steps explained above with respect to FIGS. 4-8. Also, a passivation layer 152 is generally formed over the entire wafer. As will be understood, via 140 is positioned in electrical contact with metal oxide semiconductor layer 40 so that each TFT of each associated pixel of MOTFT backplane 150 is in controlling contact with the PIN in the associated pixel of the array. The entire structure thus forms an Active Matrix Light Emitting Diode (AMLED) array, generally designated 160 in FIG. 12.

As explained above, the high power density projector formed by the AMOLED produces sufficient heat to require some heat dissipation. Further, as will be understood the heat dissipation has to go through some type of heat spreader. Most heat spreaders include some high heat conduction material (e.g. metal) and are not transparent and therefore a normal heat spreader can only be thermally connected to the upper side of MOTFT backplane 150. The dielectric layer(s) of MOTFT backplane 150 and passivation layer 152 are not a good thermal conductor(s). Heat plugs 162 are therefore introduced in AMLED array 160 to be used for high power density applications.

Referring to FIG. 12 heat plug 162 is made with a metal material which connects directly with the n-layer 112 of the LED and is isolated from the rest of the electronics by planarization layer 134. Heat plug 162 extends upwardly through MOTFT backplane 150 and passivation layer 152 and can therefore be connected to a heat spreader and/or heatsink (not shown) preferably positioned on passivation layer 152. The heat spreader, because of voltage on n-layer 112 of the LED, is held at a fixed voltage. Metal heat plug 162 is preferably thermally connected directly with any intermediate thin film dielectric in MOTFT backplane 150 because the thermal conductivity of any dielectric is at least two orders of magnitude smaller than that of metal. Heat plug 162 extends beyond MOTFT backplane 150 and is electrically isolated from MOTFT backplane 150 by passivation film 152. Heat plug 162 can also serve as a common cathode for the III-V LED array.

It will be understood that each pixel driver in MOTFT backplane 150 of AMLED array 160 can be made with at least two MOTFTs and one storage capacitor (2T1C). More complicated pixel circuits with additional MOTFTs, buslines, and capacitors can also be incorporated and used. Many pixel circuit designs for thin film organic light emitting diode (OLED) arrays have been proposed in the past decades for compensating either large size inhomogeneity or performance degradation in transistors or in OLEDs. Similar design principles can also be used for the pixel circuit used in AMLED array 160 disclosed herein. It should be noted specifically that due to the superb current-voltage stability in the LED and in the MOTFT, simple 2T1C pixel drivers can be used for driving emitting elements made in the LED array.

When AMLED array 160 is designed with 50 μm pixel pitch, a high-definition (HD) AMLED array (1280×768~$10^6$ pixels) and a full HD (1920×1080~2.1×10⁶ pixels) AMLED array can be achieved in 64 mm×38.4 mm and in 96 mm×54 mm sizes. In addition to using a single wafer, AMLED with such sizes and beyond can be achieved by tiling multiple small size AMLED tiles together. Projectors for indoor home theater or public area with a wall size display screen, the AMLED array can be made with smaller pixel pitch in 10-50 µm range. For the case of a full HD, AMLED array with 20 µm pixel pitch, the total active display area is 3.84 cm×2.16 cm~8.3 cm². When such a display is operating at 10 A/cm² with LED current efficiency of ~100 cd/A, the total output emission intensity will be ~8,300 cd (~26,000 lm). This is sufficient for a display screen in 4 m×2 m-6 m×3 m (8-18 m²) area.

Such high information content displays are typically made in full-color form. Three approaches can be used for achieving full-color: (1) For projectors aiming for relatively small screen or low ambient light environment, one could use the blue screen made with GaN LED array, and a color filter wheel with luminescent color filters converting the blue color into green and red color at different frame time. It is called RGB color sequencing, and has been known to experts in the field; (2) For high power projectors for commercial cinemas, sport arenas or side-wall of high-rise buildings, one could integrate three AMLED arrays with blue, green and red colors into a single optical system. The green color AMLED can be either achieved with LED array with green emission color (such as InGaN/GaN-based), or with a blue LED array plus a sheet of green luminescent filter. The red color AMLED can be either achieved with LED array with red emission color LED (such as AlInGaP-based), or with a blue LED plus a sheet of red luminescent filter. This full-color method has also been known to experts in the field; and (3) For applications that do not need as high a pixel count as in (1), one could place an energy down-conversion color filter layer in front of the blue LED/LD array (similar to that shown in US for AMOLED displays).

In general, the device architectures disclosed in U.S. application Ser. No. 13/713,744 (4674-A27) and in this application can be extended for other applications. For example, one can integrated a readout circuit array with MOTFT over a CMOS or a CCD image array made with a silicon wafer, or multiple wafer tiles with pixel pitch of 1-2 µm, billion pixel image arrays can be achieved with large field of view and with a selectivity to special area and variable resolutions. Similar concepts can also be used for AMLED arrays. When the bottom wafer is replaced with other types of sensor arrays, or Si-wafer based integrating circuits, stacking type integrating circuits can be achieved for many different applications.

The PIN LED array in FIG. 10 can be replaced with PIN vertical cavity surface emitting laser diode (LD) array with the same process flow. The emitting display device disclosed in this invention can thus be either AMLED or AMLD.

In FIGS. 10-12, the p-i-n stack is illustrated with an n-layer at the bottom. The same process flow is also suitable for the p-i-n stack with a p-layer on the bottom.

Thus, a high pixel density, active matrix LED/LD array for high power projector displays has been disclosed. The present invention provides an AMLED/AMLD display with MOTFT pixel driver circuits on top of a PIN LED array without the complication of a solder bonding layer. Also, the present invention provides an AMLED display with improved thermal dissipation/conduction, improved current density and improved output optical power. In addition, the present invention provides a new and improved process for fabricating an active matrix light emitting array with a metal-oxide thin film transistor (MOTFT) array which also uses a fewer number of process steps.

Various changes and modifications to the embodiment herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

1. A method of fabricating a pixelated projector display comprising the steps of:
   providing a III-V LED/LD wafer including a supporting substrate, a first type semiconductive layer on the substrate, and a second or opposite type semiconductive layer overlying the first type semiconductor layer;
   patterning the III-V LED/LD wafer into an array of LEDs/LDs;
   depositing a planarization layer over the array of LEDs and forming vias through the planarization layer, one via for each LED/LD in the LED/LD array;
   forming a MOTFT backplane including an array of MOTFT pixel driver circuits on the planarization layer, one driver circuit in controlling electrical communication with each via through the planarization layer, whereby an AMLED/AMLD display is formed;
   depositing a passivation layer over the array of MOTFT driver circuits; and
   extending heat plugs between adjacent LEDs/LDs in the LED/LD array through the passivation layer, the MOTFT backplane, the planarization layer, and the III-V LED/LD wafer partially through the first type semiconductive layer to thermally couple heat from the array of LEDs/LDs to the surface of the passivation layer, an upper end of the heat plugs being accessible for thermally coupling to a heat spreader and/or a heatsink.

2. A method as claimed in claim 1 wherein the III-V LED/LD wafer further includes an emission layer positioned between the first type semiconductor layer and the second type semiconductor layer.

3. A method as claimed in claim 2 wherein the emission layer includes GaN, InGaN, or AlInGaP.

4. A method as claimed in claim 1 wherein the first type semiconductive layer is an n-type semiconductor and the second or opposite type semiconductive layer is a p-type semiconductor.

5. A method as claimed in claim 1 wherein the first type semiconductive layer is a p-type semiconductor and the second or opposite type semiconductive layer is an n-type semiconductor.

6. A method as claimed in claim 1 wherein the step of patterning the III-V LED/LD wafer includes:
   depositing a dry-etchable metal layer on the III-V LED/LD wafer;
   depositing a first layer of SiN on the dry-etchable metal layer; and
   etching the first layer of SiN and the dry-etchable metal layer into an array of isolated islands, the array of isolated islands being etched between adjacent islands to a mid-portion of the first type semiconductor layer, the array of isolated islands forming a pixelated III-V LED/LD array with each island corresponding to an emission area of each III-V LED/LD of the array.

7. A method as claimed in claim 6 further including steps of depositing a second layer of SiN on the array of isolated islands, patterning the second and the first layers of SiN on an upper surface of each island in the array of isolated islands to open a top contact of each LED/LD element, depositing a blanket layer of reflective metal over the upper surface, and etching the reflective metal in a bottom valley area between adjacent islands to isolate the reflective metal layer between adjacent island.

8. A method as claimed in claim 7 wherein the heat plugs are electrically isolated from the reflective metal layer by the planarization layer.

9. A method of fabricating a pixelated projector display comprising the steps of:
providing a III-V LED/LD wafer including a supporting substrate, a first type semiconductive layer on the substrate, an emission layer on the first type semiconductive layer, and a second or opposite type semiconductive layer on the emission layer;
patterning the III-V LED/LD wafer into an array of LEDs/LDs, the patterning including depositing a dry-etchable metal layer on the III-V LED/LD wafer, depositing a first layer of SiN on the dry-etchable metal layer, and etching the first layer of SiN and the dry-etchable metal layer into an array of isolated islands, each island corresponding to an emission area of each LED/LD in the array of LEDs/LDs;
depositing a second layer of SiN on the array of isolated islands, patterning the second and the first SiN layers on an upper surface of each island in the array of isolated islands to open a top contact area of each LED/LD, and depositing a blanket layer of reflective metal on the second layer of SiN and the top contact area of each LED/LD, and etching the reflective metal in a bottom valley area between adjacent islands of the array of isolated islands to isolate the reflective metal layer between adjacent islands of the array of isolated islands;
depositing a planarization layer over the exposed surface and forming vias through the planarization layer, one via for each LED/LD in the LED/LD array;
forming a MOTFT backplane including an array of MOTFT pixel driver circuits on the planarization layer, one pixel driver circuit in controlling electrical communication with each via through the planarization layer, whereby an AMLED/AMLD display is formed;
depositing a passivation layer over the MOTFT backplane; and
extending heat plugs between adjacent islands of the array of isolated islands through the passivation layer, the MOTFT backplane, the planarization layer, and the III-V LED/LD wafer partially through the first type semiconductive layer to thermally couple heat from the array of LEDs/LDs to the surface of the passivation layer, an upper end of the heat plugs being accessible for thermally coupling to a heat spreader and/or a heatsink.

10. A method as claimed in claim 9 wherein the heat plugs are electrically isolated from the layer of reflective metal by the planarization layer.

11. A method as claimed in claim 9 wherein the emission layer includes GaN, InGaN or AlInGaP.

12. A method as claimed in claim 9 wherein the first type semiconductive layer is an n-type semiconductor and the second or opposite type semiconductive layer is a p-type semiconductor.

13. A method as claimed in claim 9 wherein the first type semiconductive layer is a p-type semiconductor and the second or opposite type semiconductive layer is an n-type semiconductor.

14. A structure including a pixelated projector display comprising:
a III-V LED/LD wafer including a supporting substrate, a first type semiconductive layer on the substrate and a second or opposite type semiconductive layer overlying the first type semiconductive layer;
the III-V LED/LD wafer defining an array of isolated LEDs/LDs;
a planarization layer positioned over the array of LEDs/LDs and vias extending through the planarization layer, one via for each LED/LD in the LED/LD array;
a MOTFT backplane including an array of MOTFT pixel driver circuits positioned on the planarization layer, one driver circuit in controlling electrical communication with each via through the planarization layer, whereby an AMLED/AMLD display is formed;
a passivation layer positioned over the array of MOTFT driver circuits; and
heat plugs extending between adjacent LEDs/LDs of the array of isolated LEDs/LDs through the passivation layer, the MOTFT backplane, the planarization layer, and the III-V LED/LD wafer partially through the first type semiconductive layer to thermally couple heat from the array of LEDs/LDs to the surface of the passivation layer, an upper end of the heat plugs being accessible for thermally coupling to a heat spreader and/or a heatsink.

15. A structure including a pixelated projector display as claimed in claim 14 wherein the III-V LED/LD wafer includes:
a dry-etchable metal layer deposited on the III-V LED/LD wafer;
a first layer of SiN deposited on the dry-etchable metal layer; and
the first layer of SiN and the dry-etchable metal layer formed into an array of isolated islands, the array of isolated islands being etched between adjacent islands to a mid-portion of the first type semiconductor layer, the array of isolated islands forming a pixelated III-V LED/LD array with each island corresponding to an emission area of each III-V LED/LD of the array.

16. A structure including a pixelated projector display as claimed in claim 15 further including a second layer of SiN deposited on the array of isolated islands, the first layer of SiN and the second layer of SiN being open on an upper surface of each island in the array of isolated islands to define a top contact of each LED/LD element, a blanket layer of reflective metal deposited over the upper surface, and the reflective metal removed in a bottom valley area between adjacent islands to isolate the reflective metal layer between adjacent island.

17. A structure including a pixelated projector display as claimed in claim 16 wherein the heat plugs are electrically isolated from the reflective metal layer by the planarization layer.

18. A structure including a pixelated projector display as claimed in claim 14 wherein the III-V LED/LD wafer further includes an emission layer positioned between the first type semiconductor layer and the second or opposite type semiconductor layer.

19. A structure including a pixelated projector display as claimed in claim 18 wherein the emission layer includes GaN, InGaN and/or AlInGaP.

20. A structure including a pixelated projector display as claimed in claim 14 wherein the first type semiconductive layer is an n-type semiconductive layer and the second or opposite type semiconductive layer is a p-type semiconductive layer.

21. A structure including a pixelated projector display as claimed in claim 14 wherein the first type semiconductive layer is a p-type semiconductive layer and the second or opposite type semiconductive layer is an n-type semiconductive layer.

22. A structure including a pixelated projector display comprising:
   a III-V LED/LD wafer including a supporting substrate, a first type semiconductive layer on the substrate, an emission layer on the first type semiconductive layer, and a second or opposite type semiconductive layer on the emission layer;
   a dry-etchable metal layer deposited on the III-V LED/LD wafer, a first layer of SiN deposited on the dry-etchable metal layer, and the first layer of SiN and the dry-etchable metal layer defining an array of isolated islands with each island corresponding to an emission area of each LED/LD in an array of LEDs/LDs;
   a second layer of SiN deposited on the array of isolated islands, the first SiN layer and the second SiN layer defining a contact area on an upper surface of each island in the array of isolated islands;
   a layer of reflective metal deposited and patterned over the top, the contact area and the sides of each island;
   a planarization layer deposited over the layer of reflective metal and between adjacent islands of the array of isolated islands with vias extending through the planarization layer into electrical contact with the layer of reflective metal, one via for each LED/LD in the LED/LD array;
   a MOTFT backplane including an array of MOTFT pixel driver circuits positioned on the planarization layer, one driver circuit in controlling electrical communication with each via through the planarization layer, whereby an AMLED/AMLD display is formed;
   a passivation layer positioned over the MOTFT backplane; and
   heat plugs extending between adjacent islands of the array of isolated islands through the passivation layer, the MOTFT backplane, the planarization layer, and the III-V LED/LD wafer partially through the first type semiconductive layer to thermally couple heat from the array of LEDs/LDs to the surface of the passivation layer, an upper end of the heat plugs being accessible for thermally coupling to a heat spreader and/or a heatsink.

23. A structure including a pixelated projector display as claimed in claim 20 wherein the heat plugs are electrically isolated from the array of LEDs/LDs by the planarization layer.

24. A structure including a pixelated projector display as claimed in claim 20 wherein the emission layer includes GaN, InGaN or AlInGaP.

25. A structure including a pixelated projector display as claimed in claim 20 wherein the first type semiconductive layer is an n-type semiconductor and the second or opposite type semiconductive layer is a p-type semiconductor.

26. A structure including a pixelated projector display as claimed in claim 20 wherein the first type semiconductive layer is a p-type semiconductor and the second or opposite type semiconductive layer is an n-type semiconductor.

* * * * *